United States Patent
Baumgart et al.

(10) Patent No.: US 8,276,272 B2
(45) Date of Patent: Oct. 2, 2012

(54) METHOD FOR APPLYING A CONNECTION MATERIAL

(75) Inventors: Karsten Baumgart, Bad Pyrmont (DE); Klaus-Dieter Hellmig, Bad Pyrmont (DE); Georg Reuter, Schieder-Schwanlenberg (DE); Hermann Moehlenbein, Aerzen (DE)

(73) Assignee: Phoenix Contact GmbH & Co. KG (DE)

( * ) Notice: Subject to any disclaimer, the term of this patent is extended or adjusted under 35 U.S.C. 154(b) by 436 days.

(21) Appl. No.: 12/600,315

(22) PCT Filed: Jun. 9, 2008

(86) PCT No.: PCT/EP2008/004586
§ 371 (c)(1),
(2), (4) Date: Jan. 21, 2010

(87) PCT Pub. No.: WO2008/155040
PCT Pub. Date: Dec. 24, 2008

(65) Prior Publication Data
US 2010/0147553 A1    Jun. 17, 2010

(30) Foreign Application Priority Data

Jun. 20, 2007  (DE) .......................... 10 2007 028 811

(51) Int. Cl.
*H01R 43/16* (2006.01)
(52) U.S. Cl. ............. 29/874; 29/527.1; 29/837; 29/840; 29/843; 29/844; 228/180.1; 228/225; 228/248.1
(58) Field of Classification Search ............ 29/874, 29/527.1, 834, 837, 840, 843, 844; 174/126.1, 174/255, 260, 261, 263, 267; 228/180.1, 228/180.21, 180.22, 225, 248.1
See application file for complete search history.

(56) References Cited

U.S. PATENT DOCUMENTS
5,492,266 A    2/1996   Hoebener et al.
(Continued)

FOREIGN PATENT DOCUMENTS
DE    196 34 646 A1    3/1998
(Continued)

OTHER PUBLICATIONS

European Patent Office, International Search Report, dated Nov. 7, 2008, Officer: Denis Nerve.
European Patent Office, International Preliminary Report on Patentability, Dated Oct. 1, 2009.
(Continued)

*Primary Examiner* — Thiem Phan
(74) *Attorney, Agent, or Firm* — Kaplan Breyer Schwarz & Ottesen

(57) ABSTRACT

The invention relates to a method for applying a connection material with a specified shape on at least one surface of at least one workpiece, wherein the connection material and the surface have complementary wetting or wettable properties, and wherein the connection material (3) is deposited on at least one of the surfaces (2) and a shaping device (10, 10') is arranged at least for the period of a flowable state of the connection material adjacent to the connection material as well as at least partially surrounding this material on the surface (2), wherein this device has a surface (11, 12) that is non-wettable with respect to the wetting properties of the connection material and that is designed for the forced guidance of the flow of the still flowable connection material in the region of the non-wettable surface that thus assumes a specified shape; and the shaped connection material is hardened.

4 Claims, 3 Drawing Sheets

U.S. PATENT DOCUMENTS

| | | | |
|---|---|---|---|
| 5,762,259 A | | 6/1998 | Hubacher et al. |
| 5,825,629 A | * | 10/1998 | Hoebener et al. ............. 361/777 |
| 6,376,782 B1 | * | 4/2002 | Kimura et al. ................ 174/267 |
| 6,660,946 B2 | * | 12/2003 | Saiki et al. .................... 174/267 |
| 2003/0166331 A1 | | 9/2003 | Tong et al. |
| 2005/0127508 A1 | | 6/2005 | Lee et al. |

FOREIGN PATENT DOCUMENTS

EP        1 263 272 A2    12/2002

OTHER PUBLICATIONS

International Bureau, "Application No. PCT/EP2008/004586 International Preliminary Report on Patentability", Feb. 11, 2010, Publisher: PCT, Published in: EP.

"German Office Action for German International Application No. 10 2007 028 811.7-24", Dated: Jun. 5, 2008, Publisher: German Office Action, Published in: DE.

* cited by examiner

METHOD FOR APPLYING A CONNECTION MATERIAL

FIELD OF THE INVENTION

The invention relates to a method for applying a connection material with a specified shape on at least one surface of at least one workpiece, wherein the connection material and the surface have complementary wetting or wettable properties, as well as a connection material that could be applied by such a method.

BACKGROUND OF THE INVENTION

Especially in fields that use surface mounting technology or SMT for placing components on carriers, such as, e.g., blanks, solder connections between metallic terminal pins and soldering lands formed on a printed-circuit board or PCB are often used for forming mechanical and electrical connections.

Today, for providing the soldering lands, a metallic layer that is to be connected to the solder is deposited on circuit boards usually produced from plastic. Here, an adhesive bond between the circuit board and the solder is desired. However, because the galvanic layer deposited on the plastic by a PVD (Physical Vapor Deposition) method e.g., has low adhesive strength compared with the terminal pin on the solder e.g., it barely contributes to the mechanical strength of the solder connection.

The forces generated at an advancing solder edge can be calculated according to the equation from Young, i.e., according to $$g_{SA} = g_{LS} + g_{LA} \cos \theta \quad (1)$$

where
$g_{SA}$ is the surface tension between the solid metallic workpiece layer (e.g., copper) and air,
$g_{LS}$ is the surface tension between the liquid solder and solid metallic material layer, and
$g_{LA}$ is the surface tension between the liquid solder and air and
$\theta$ is the wetting angle that is a measure of the wettability of a material. In the case of $\theta=0°$, a solder drop covers the metallic workpiece layer essentially as a single-molecule layer, while in the case of $\theta=180°$, the liquid solder assumes the shape of a ball.

SUMMARY OF THE INVENTION

In the scope of the invention and also for the following description and the claims, the terms "wet(ting)" and "wettable" are used in the sense that the wetting material is capable of flowing and that hardening and the wettable material permanently assumes a solid state during the wetting process, wherein corresponding material properties that allow wetting or wettability are complementary, i.e., that for a solder connection, the wetting material is a solder material and the wettable material has a solderable outer layer.

One problem addressed by the invention consists of achieving an increase in the adhesive strength of connections formed by means of wetting.

The invention thus provides a method for applying a connection material with a specified shape on at least one surface of at least one workpiece, wherein the connection material and the surface have complementary wetting or wettable properties. Here, the connection material is deposited on the surface, a shaping device is positioned on the surface at least for the period of a flowable state of the connection material and is positioned on the surface in the vicinity of the connection material, wherein the device has a surface that is non-wettable with respect to the wetting properties, so that the flow of the still flowable connection material is forcibly guided in the region of the non-wettable surface and thus assumes a specified shape; and the shaped connection material hardens.

One essential advantage of the invention is that, through the geometry of the non-wettable surface of the shaping device, the not yet molten connection material is guided by the forced-guidance shaping oriented or targeted to certain regions of wettable surfaces. Thus, in this way, a higher outflow on the surfaces of the connection partner leading to an overall higher adhesive strength can be utilized or achieved. In the case of solder connections, e.g., a non-wettable surface, i.e., a non-solderable surface of the shaping device made from plastic or ceramic or another corresponding material has proven to be preferable, advantageously also for a higher outflow for metallic terminal pins that are connected by an SMT soldering point to a printed-circuit board.

BRIEF DESCRIPTION OF THE DRAWINGS

Additional advantages and features are clear from the following description with reference to a preferred, but only example embodiment with reference to the accompanying drawings. Shown in the drawings are.

DETAILED DESCRIPTION

Figure 1:
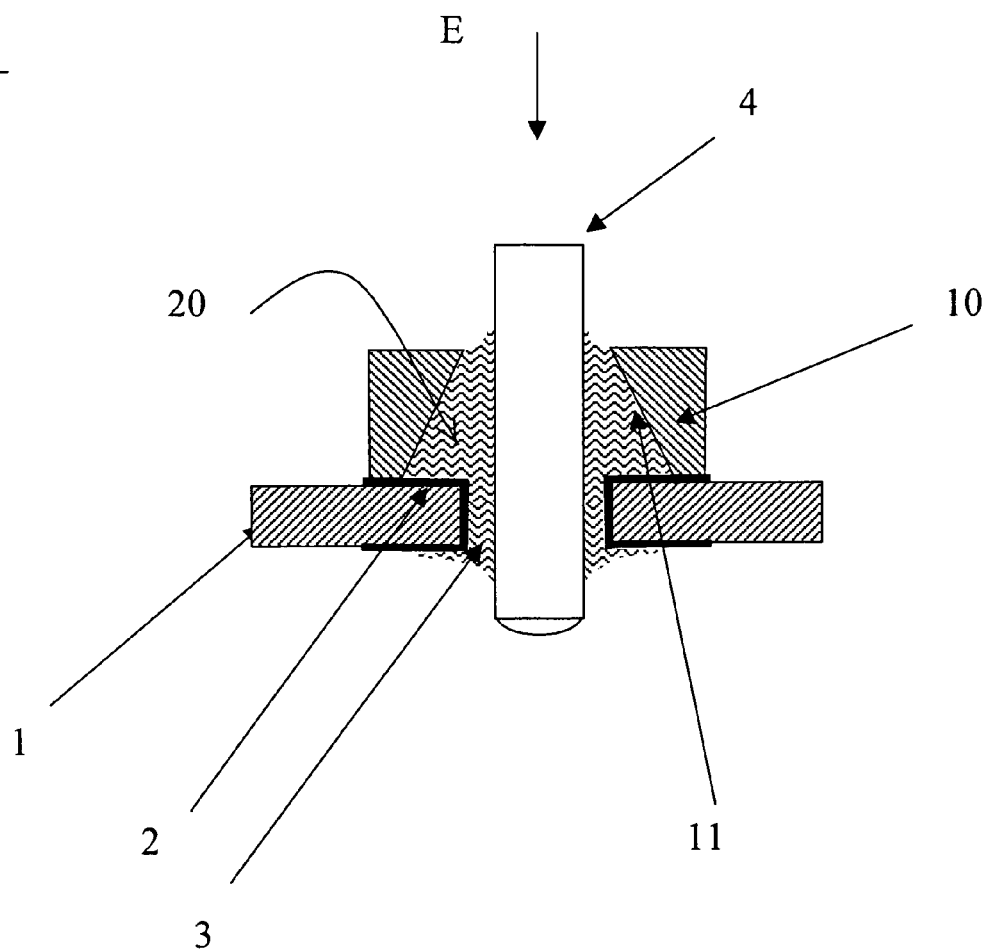
FIG. 1 highly schematized, a joint connection according to the invention with a hardened connection material that has assumed a specified shape, FIG. 2 highly schematized, a joint connection corresponding to FIG. 1 according to the state of the art with a hardened connection material that has assumed a shape involving the characteristic properties of the wetting and wettable surfaces without a shaping device, FIGS. 3a to 3c individual stations of an example reflow method for the production of a joint connection according to the state of the art, FIGS. 4a to 4c stations corresponding to FIGS. 3a to 3c for the production of a joint connection according to the invention, FIG. 5 highly schematized, an alternative shaping device with a view of the end to be set on a circuit board, FIG. 6 an alternative joint connection to FIG. 1 in the scope of the invention, and FIG. 7 another alternative joint connection to FIG. 1 in the scope of the invention.

Below, for the example description of preferred embodiments according to the invention, initially FIGS. 1 and 2 will be discussed, which show, greatly simplified for the sake of simplicity, corresponding joint connections—in the considered case, solder connections—wherein the connection material 3 according to FIG. 1 is hardened according to the invention, assuming a specified shape or, according to FIG. 2, has assumed a shape involving the characteristic properties of the wetting and wettable surfaces without an additional shaping device according to prior art.

Figure 2:
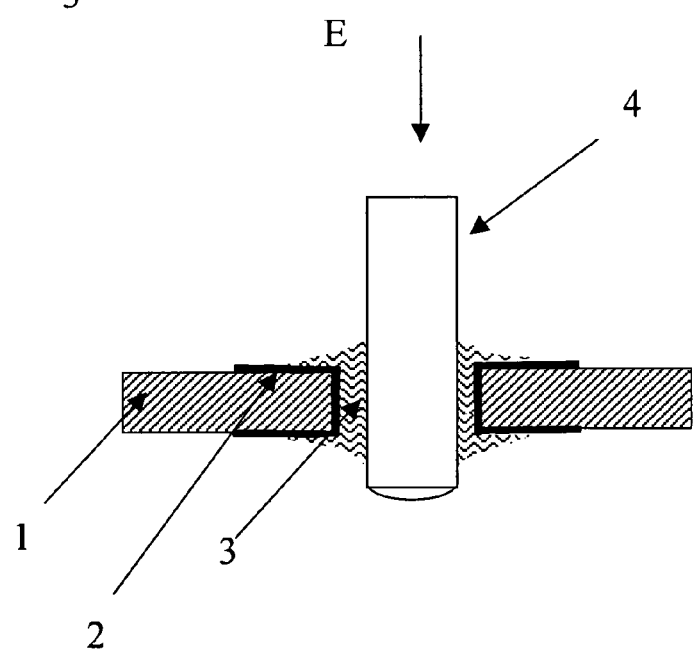

In detail, FIGS. 1 and 2 each show a highly schematized section through a circuit board 1 based on plastic material, wherein the conductive traces are not shown for reasons of simplicity. In the example shown, on the circuit board 1, a metallic layer 2 of copper is deposited, which is connected in an electrically conductive manner to one or more conductive traces. The metallic layer or the soldering land 2 is guided by the circuit board in a type of via contact. A metallic terminal pin 4 of an assembly (not shown in more detail), which has been inserted in the direction E, extends through the soldering land 2.

The electrical and mechanical connection of the terminal pin 4 to the circuit board 1 is realized by means of the soldering material that is deposited on the soldering land 2 and on the terminal pin 4 and that has spread out during the transition from a flowable state into the hardened state between the terminal pin 4 and the soldering land 2. The solder that is used on one side and the soldering land, as well as the terminal pin on the other side, have complementary wetting or wettable properties for the wetting performed here.

As can be seen from FIGS. 1 and 2, in the case of the joint connection according to the invention (FIG. 1), a shaping device 10 has been used on the surface of the circuit board, in the case of FIG. 1, set on the soldering land 2. This shaping device 10 has a hollow cone-like opening that tapers from the circuit board 1 counter to the insertion direction E of the terminal pin 4, but also defines a gap to the terminal pin for spacing.

At least the inner surface 11 of the shaping device 10 has non-wettable properties with respect to the wetting properties of the solder 3 that is used and is thus not solderable in this case.

The added shaping device 10 has the effect that a solder material that is initially deposited on the wettable surface of the circuit board 1, e.g., in the case of a reflow method, as a solder paste and that is also deposited on its surface through the subsequent insertion of the terminal pin 4, spreads out after heating and transformation into a flowable state along the gap between the terminal pin 4 and the inner space 20 defined by the shaping device 10 as well as along the remaining gap between the terminal pin 4 and the via-contacted region. At least during the period of a flowable state of the solder material, the shaping device 10 thus remains arranged on the surface of the circuit board, as can be seen in FIG. 1. After the hardening of the solder material in a forcibly guided way, thereby assuming a specified shape, specific to the application, the added shaping device can again be removed.

Figure 3A:
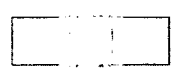
Figure 4A:
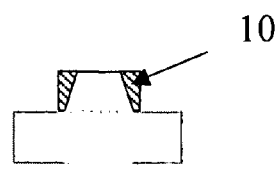
Figure 3B:
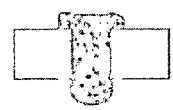
Figure 4B:
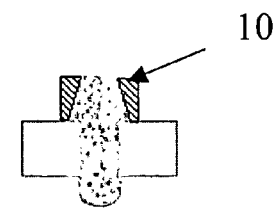
Figure 3C:
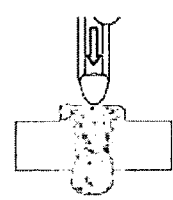
Figure 4C:
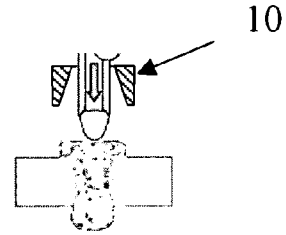

Individual stations of such an example reflow method are to be taken, for the production of a joint connection according to FIG. 2, that is, according to the state of the art, from FIGS. 3*a* to 3*e* and for the production of a joint connection according to FIG. 1, that is, according to the invention, from FIGS. 4*a* to 4*c*. FIGS. 3*a* and 4*a* show a circuit board with a metallic layer and borehole via-contacted in this way. According to FIG. 4*a*, a shaping device 10 is also already set on the "upper" surface of the circuit board.

FIGS. 3*b* and 4*b* show relevant arrangements with deposited solder paste, wherein the borehole is also filled with solder paste, a circuit board with a metallic layer, and a borehole via-contacted in this way. According to FIG. 4*b*, the interior of the shaping device 10 could also be filled with solder paste.

In FIGS. 3*c* and 4*c*, the circuit board is equipped with a not-shown component, and here a terminal pin is inserted into the borehole. According to FIG. 4*c*, it is also possible according to the invention to first place the shaping device 10 on the "top" circuit board surface in this step. Inserting the terminal pin initially presses the solder paste through the borehole. The solder then melts through a reflow process in a known way and the melted solder "creeps" back on the terminal pin in the opposite direction and forms, according to the state of the art, i.e., without the use of a shaping device 10 according to the invention, a characteristic solder cone according to FIG. 2 or, with the use of an added shaping device 10, the shape specified by said device according to FIG. 1. At the latest at the time at which the solder material is transformed into a flowable state, the shaping device 10 must be arranged accordingly within the scope of the invention.

Through the use of a shaping device according to the invention with properties that are non-wettable with respect to the wetting properties of the connection material, the flowable connection material can thus be forcibly guided, and thus a higher outflow on the terminal pin can also be generated. This higher outflow is in direct relation to a larger wetted surface area, wherein increased adhesive strength of the connection position can also be directly obtained.

Simultaneously, as to be taken, e.g., from FIG. 4*b*, an increase of the solder quantity is also possible, so that the wettable surface area, e.g., on the terminal pin, is wetted still more. Such a higher quantity of solder could be deposited, e.g., by a stepped template or by means of a dispenser.

The non-wettable surface of the shaping device formed for the forced guidance of the solder can be devised merely through the material selection during the production of the shaping device and/or through the use of separating means later deposited on the surface or corresponding wetting-reducing substances. The geometry of the non-wettable surface of the shaping device, the soldering land in connection with the specific shape of the non-wettable surface acts on the achievable adhesive strength of the connection for a hardened connection material.

Figure 5:
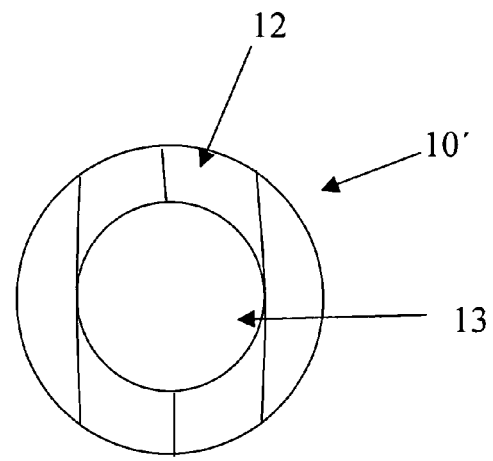

For example, as an alternative to a shaping device 10 that provides only a hollow, conically shaped surface for the forced guidance of the flowable connection material, a cylindrical shaping device 10' has also proven to be particularly useful, which is formed according to FIG. 5 with a V-shaped groove or notch 12 that tapers, in turn, against the insertion direction of a terminal pin, and has an inner cylindrical opening 13 that still defines a gap for spacing for the inserted terminal pin. FIG. 5 thus shows a top view of the end of the shaping device 11' according to the invention set on a circuit board.

Figure 6:
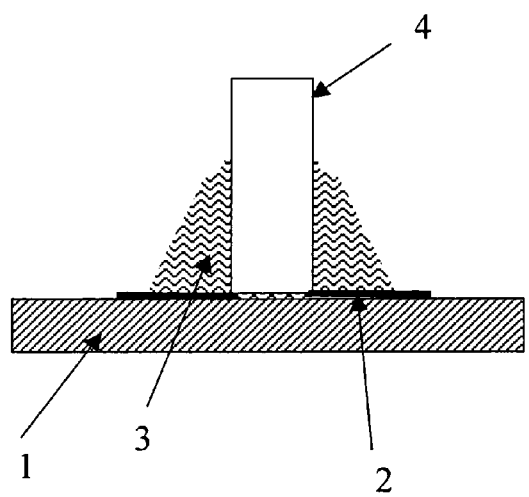
Figure 7:
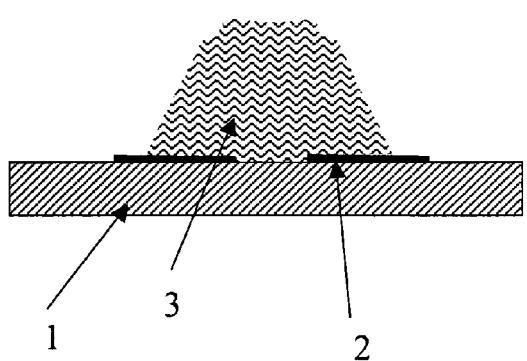

As an alternative to the diagram according to FIG. 1, the soldering land 2 could also be constructed, e.g., according to FIG. 6, such that a terminal pin is not to be inserted into the circuit board, but is merely to be set on the soldering land. The connection material here is hardened and the additional shaping device is again removed. The special arrangements of a metallic layer and end point of an inserted or placed terminal pin arranged on the circuit board are here essentially dependent on the corresponding soldering method. Also, for depositing a connection material with a specified shape according to the invention, the use of a terminal pin is not necessary, as is to be taken, e.g., from FIG. 7. In addition, in FIG. 7, an additional shaping device used during a flowable state of the connection material has also been again removed after hardening of the connection material. Furthermore, the shaping device 10 or 10' could also be formed, e.g., on other components, such as, e.g., on a bar-like component that accommodates a plurality of terminal pins and is stored on a reel by an SMT pick-and-place machine.

For example, through the use of a shaping device similar to FIG. 5, for a round soldering land geometry that was produced from a metallic layer 500 µm thick, on which terminal pins were then placed, after a reflow process, the values shown in the following table are achieved.

|  | Quantity of Solder | Tensile Strength |
| --- | --- | --- |
| Standard Method | 250 μm | ca. 60 N |
| Invention | 250 μm | ca. 90 N |
| Invention | 500 μm | ca. 110 N |

The invention thus allows, in defined regions of a joint connection produced by means of a flowable, hardening connection material, an increase of the connection material on wettable regions before hardening, so that the mechanical strength after hardening of the connection material is increased. According to the invention, basically, this is due to the fact that because a typical 360° peripheral wetting is restricted by non-wettable surfaces of an additional shaping device, the connection material is forcibly guided in the flowable state and consequently the remaining wettable portion is wetted more.

The method according to the invention is suitable, in principle, for lead-bearing but also for lead-free solders as well as for adhesives and other flowable connection materials that transform after hardening into a solid shape and that have wetting properties.

The invention claimed is:

1. Method for applying a connection material with a specified shape on at least one surface of at least one workpiece, wherein the connection material and the surface have complementary wetting or wettable properties, the method comprising:

depositing the connection material (3) on a surface (2), arranging a shaping device (10, 10') with an opening at least for the period of a flowable state of the connection material adjacent to the connection material as well as at least partially surrounding the connection material on the surface (2), wherein the shaping device has a surface (11, 12) that is non-wettable with respect to the wetting properties of the connection material and that is designed for the forced guidance of the flow of the still flowable connection material in the region of the non-wettable surface, wherein the flow thus assumes a specified shape of shaped connection material, wherein a gap is defined between the shaping device and a terminal pin inserted into the opening and, in this way, a higher outflow of the connection material on the terminal pin is also generated; and hardening the shaped connection material.

2. Method according to claim 1, wherein a solderable or adhesive layer is prepared as a wettable surface and a solder connection is produced by means of a solder or an adhesive connection is produced by means of an adhesive as a joint connection.

3. Method for producing a hardened connection material assuming a specified shape, the method comprising utilizing a shaping device (10, 10') in accordance with the method of claim 1, wherein the shaped connection material hardens into the specified shape as specified by the shaping device.

4. Method according to claim 1, wherein the surface (11, 12) of the shaping device that is non-wettable by the connection material (3) is constructed for forming the connection material with a hollow, conical shape and/or with a V-shaped chamfer.

* * * * *